United States Patent
Nguyen et al.

(10) Patent No.: US 9,157,797 B2
(45) Date of Patent: Oct. 13, 2015

(54) AVALANCHE PHOTO DIODE DETECTOR CONTROL SYSTEMS AND METHOD

(71) Applicant: MAXIM INTERGRATED PRODUCTS, INC., San Jose, CA (US)

(72) Inventors: James Cong Nguyen, Portland, OR (US); Jan Filip, Portland, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 254 days.

(21) Appl. No.: 13/830,130

(22) Filed: Mar. 14, 2013

(65) Prior Publication Data

US 2014/0263946 A1 Sep. 18, 2014

(51) Int. Cl.
*G01J 1/44* (2006.01)
*H03G 3/30* (2006.01)

(52) U.S. Cl.
CPC ................ *G01J 1/44* (2013.01); *H03G 3/3084* (2013.01)

(58) Field of Classification Search
CPC ........... G01T 1/18; G01T 7/125; H01J 47/08; H01L 31/02027; H01L 31/107; H01L 29/66113
See application file for complete search history.

(56) References Cited

U.S. PATENT DOCUMENTS

2005/0001150 A1* 1/2005 Yonemura ................. 250/214 R
2006/0157646 A1* 7/2006 Uchida et al. ............. 250/214 R

* cited by examiner

*Primary Examiner* — Francis M Legasse, Jr.
(74) *Attorney, Agent, or Firm* — TIPS Group

(57) ABSTRACT

An avalanche photo diode detector including an avalanche photo diode, an adjustable voltage source, a current mirror coupled to the voltage source output of the adjustable voltage source and having a current measurement output, and a processor coupled to the adjustable voltage source and the current mirror. The processor implements a process of obtaining a signal current measurement from the current mirror, computing an estimate of an input optical power level from the signal current measurement and adjusting the output of the adjustable voltage source based upon on the estimate of the input optical power level.

18 Claims, 4 Drawing Sheets

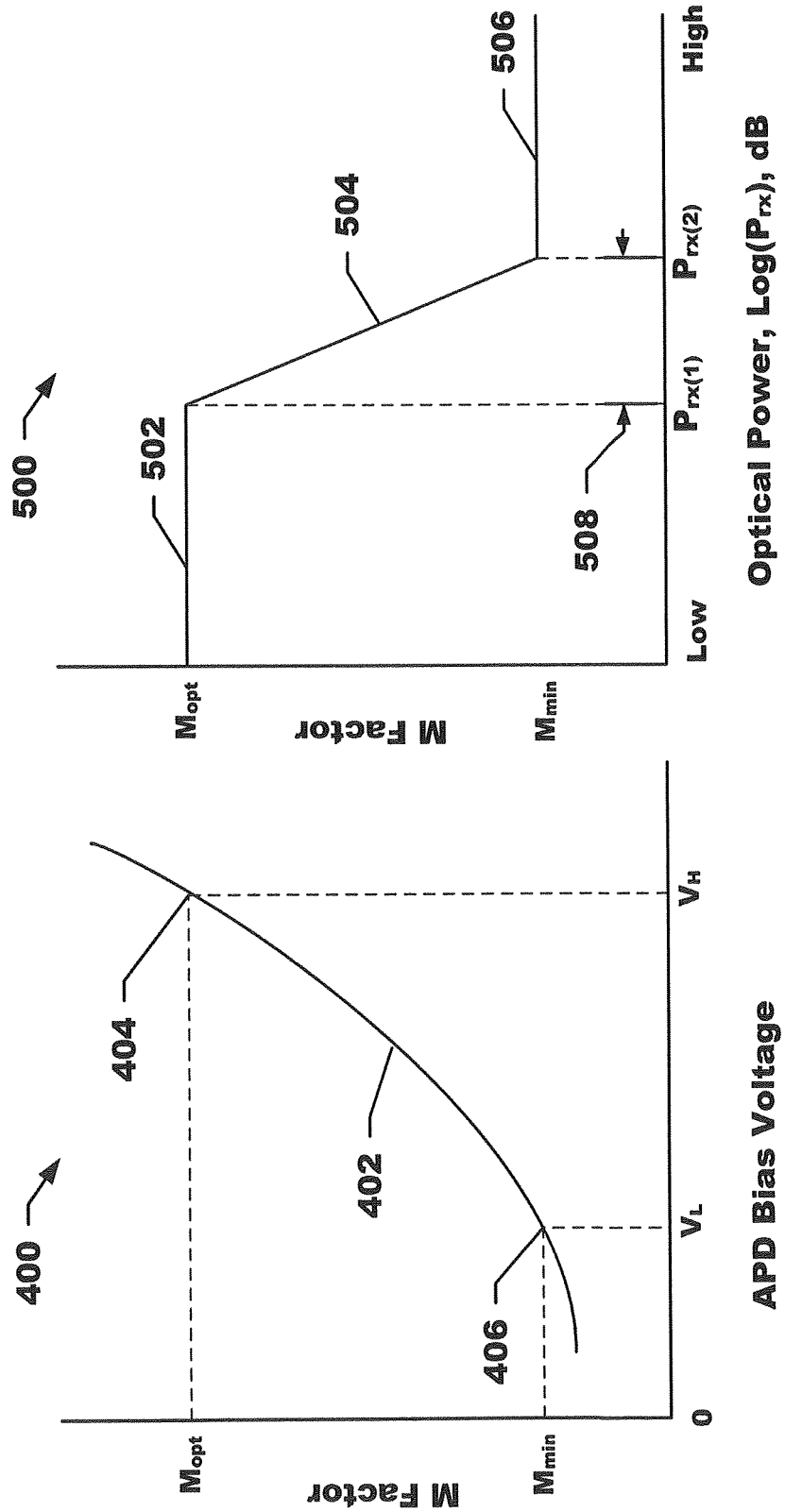

AVALANCHE PHOTO DIODE DETECTOR CONTROL SYSTEMS AND METHOD

BACKGROUND

Avalanche photo diode detectors (APD) are utilized in a wide range of applications including low level light detection, laser rangefinders, LIDAR, photon counting, optical tomography, fluorescence detection, particle sizing and counting, and communication systems. The APD is particularly useful in fiber optic based network communication systems, specifically in long-reach/high sensitivity optical receivers.

Typically, the ADP is reverse biased, during operation, by a relatively high voltage. When illuminated with photons of the proper wavelength, the diode undergoes avalanche breakdown creating a large signal current. The ratio between the current flowing with no illumination (the "dark" current) and the signal current flowing during photon induced avalanche breakdown is the APD gain, typically referred to as a dimensionless constant knows as a multiplication factor (M).

FIG. 1 is a circuit diagram of a typical APD fixed bias voltage controller 100. FIG. 2 is a graph 200 of the multiplication factor M as a function of bias voltage. Plot 202 indicates that M increases as bias voltage increases. Many circuits of the prior art, such as the circuit illustrated in FIG. 1, are designed to bias the APD at a fixed voltage $V_{target}$, to achieve a high operating gain at a multiplication factor $M_{opt}$. This maximizes light sensitivity so that even weak optical signals can be detected reliably.

With reference to FIGS. 1 and 2, a D.C. voltage source 106 feeds a voltage regulator 102 which supplies the bias voltage to APD 116. Typically voltage regulator 102 boosts the voltage levels of D.C. source 106, as many APDs require high voltages (30-100V) which are not commonly available in monolithic IC systems. Current flowing through the APD 116 ($I_{apd}$) is monitored by current mirror 104, which produces a scaled current output ($I_{apd}/k$) that is fed to the current input of analog to digital converter (ADC) 112. Voltage drop across current mirror 104 is assumed to be negligible when compared to the bias voltage $V_{bias}$. Signal current $I_{apd}$ also flows into trans-impedance amplifier (TIA) 118 to convert the signal current to output signal voltages.

Resistor $R_L$ 114 is placed in series with APD 116 to limit current at high illumination levels. A voltage divider consisting of resistors 120 and 122 ($R_{d1}$, $R_{d2}$) provides a scaled voltage $V_{fb}$ on a line 124, which is proportional to $V_{bias}$, which is fed to analog controller 108, where it is compared to the desired fixed bias voltage setpoint 126 ($V_{target}$) input to the system. A digital error correction output 128 ($V_{ctrl}$) from analog controller 108 is input to voltage regulator 102 to correct any deviations in $V_{bias}$.

The digital output 130 of A/D converter 112, which represents the value of $I_{apd}$, is sent to circuit module 110, which estimates the level of the incoming optical power level $P_{rx}$. This can be accomplished by using the formula $P_{rx}=I_{apd}/(M*R_o)$, where M is the multiplication factor and $R_o$ is the responsivity. $I_{apd}$ is measured via current mirror 104, and M can be estimated from graph 200 since the voltage drop across $R_L$ ($=I_{apd}*R_L$) is also known. $R_o$ can be estimated as a function of wavelength and/or other variables.

While the APD fixed bias voltage controller 100 of FIG. 1 has the potential advantage of simplicity, it suffers from a number of important disadvantages. For example, a disadvantage of the APD fixed bias voltage controller 100 is the need for a series resistor 114 ($R_L$) to limit the current through the APD at high input optical power levels $P_{rx}$.

FIG. 3 is a graph 300 of Optical Power versus M factor and system power consumption for the circuit of FIG. 1. A plot 304 illustrates the impact of input optical power, plotted as the $\log(P_{rx})$ in a dB scale, on the M factor. At very low optical power levels, $I_{apd}$ remains low and the voltage drop of $I_{apd}$ through $R_L$ is small compared to $V_{bias}$ (which is fixed by regulator 102). As optical power $P_{rx}$ increases, $I_{apd}$ increases due to increasing avalanche current and the voltage drop across $R_L$ increases. This reduces the effective bias voltage across the APD, lowering the M factor. At relatively low $P_{rx}$ levels, it is more desirable to keep the M factor at its optimum level, to reduce bit error rates that can occur as M factor (and bias voltage) is dropped. However, with the fixed series resistor ($R_L$) 114, the drop in M factor with increasing $P_{rx}$ is unavoidable.

Another disadvantage of 100 of FIG. 1 is power consumption. As seen in FIG. 3, a plot 302 illustrates the approximate trend in power consumption as $P_{rx}$ is increased. The output voltage from regulator 102 is held fixed held fixed independent of the $I_{apd}$ current level. Since the electrical power that must be delivered is at least $V_{bias} \times I_{apd}$, not taking into account efficiencies in regulator 102, significant increases in $I_{apd}$ will result in significant increases in power consumed by the circuit of FIG. 1. Power dissipation is increasingly critical in communication systems with high port densities or battery backed up communication systems.

A further disadvantage of APD fixed bias voltage controller 100 is that, at high $P_{rx}$ levels, the M factor must be maintained at a low value to limit the signal current through the APD. Given the functioning mechanism of the circuit of FIG. 1, the actual M factor is determined by the voltage output by regulator 102 and the voltage drop across $R_L$ 114, both of which determine the actual bias voltage across APD 116. The M factor may not be precisely controlled in that it is subject to many variables including the specific characteristics of the APD as well as circuit tolerances of $R_L$ and other components. The variability in the M factor can result in significant increases in the bit error rates which are not desirable.

These and other limitations of the prior art will become apparent to those of skill in the art upon a reading of the following descriptions and a study of the several figures of the drawing.

SUMMARY

In an embodiment, set forth by way of example and not limitation, a method for biasing an avalanche photo diode includes: providing an avalanche photo diode optically coupled to a light source, whereby the light source provides an input optical power level to the avalanche photo diode; measuring a signal current flowing through the avalanche photo diode in response to the input optical power level; computing an estimate of the input optical power level from the signal current measurement; and adjusting a voltage bias applied to the avalanche photo diode based on the estimate of the input optical power level.

In an embodiment, set forth by way of example and not limitation, an avalanche photo diode detector includes: an avalanche photo diode optically coupled to a light source, whereby the light source provides input optical power to the avalanche photo diode; an adjustable voltage source having a voltage adjustment input and a voltage source output; a current mirror coupled to the voltage source output of the adjustable voltage source and having a current measurement output; and a processor coupled to the adjustable voltage source and the current mirror. In this non-limiting example, the processor implements a process of: obtaining a signal current measurement from the current mirror; computing an estimate of an input optical power level from the signal current measurement; and adjusting the output of the adjustable voltage source based upon on the estimate of the input optical power level.

Example embodiments provide improvements in biasing stability, lower bit error rates, and lower circuit power consumption. These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 4 is a graph of the multiplication factor M as a function of APD bias voltage for an example control system embodiment;

FIG. 5 is a graph of the multiplication factor M as a function of Optical Power for an example control system embodiment.

DETAILED DESCRIPTION OF EXAMPLE EMBODIMENTS

Figure 1:
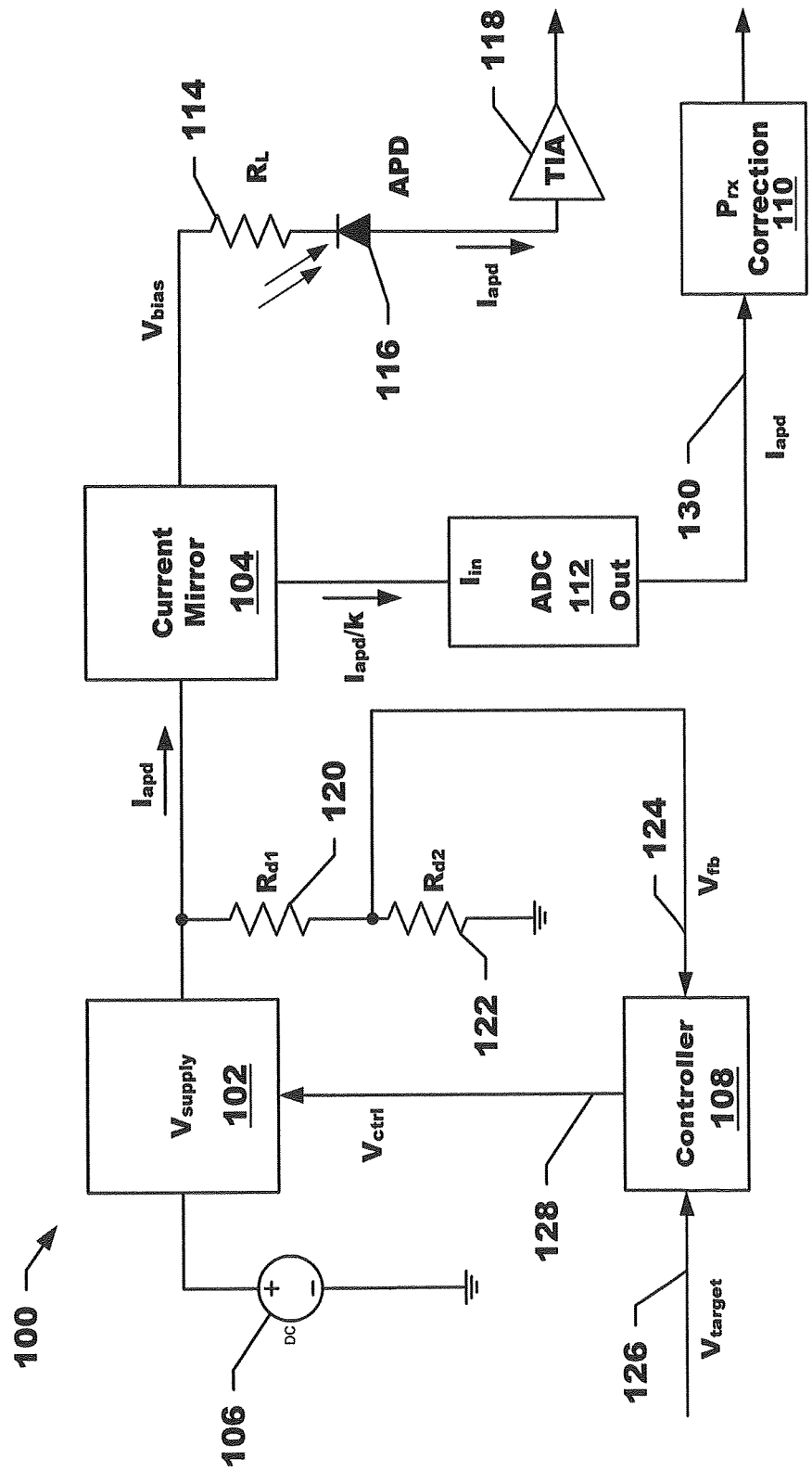
FIG. 1 is a circuit diagram of a prior art APD fixed bias voltage controller.
Figures 2, 3:
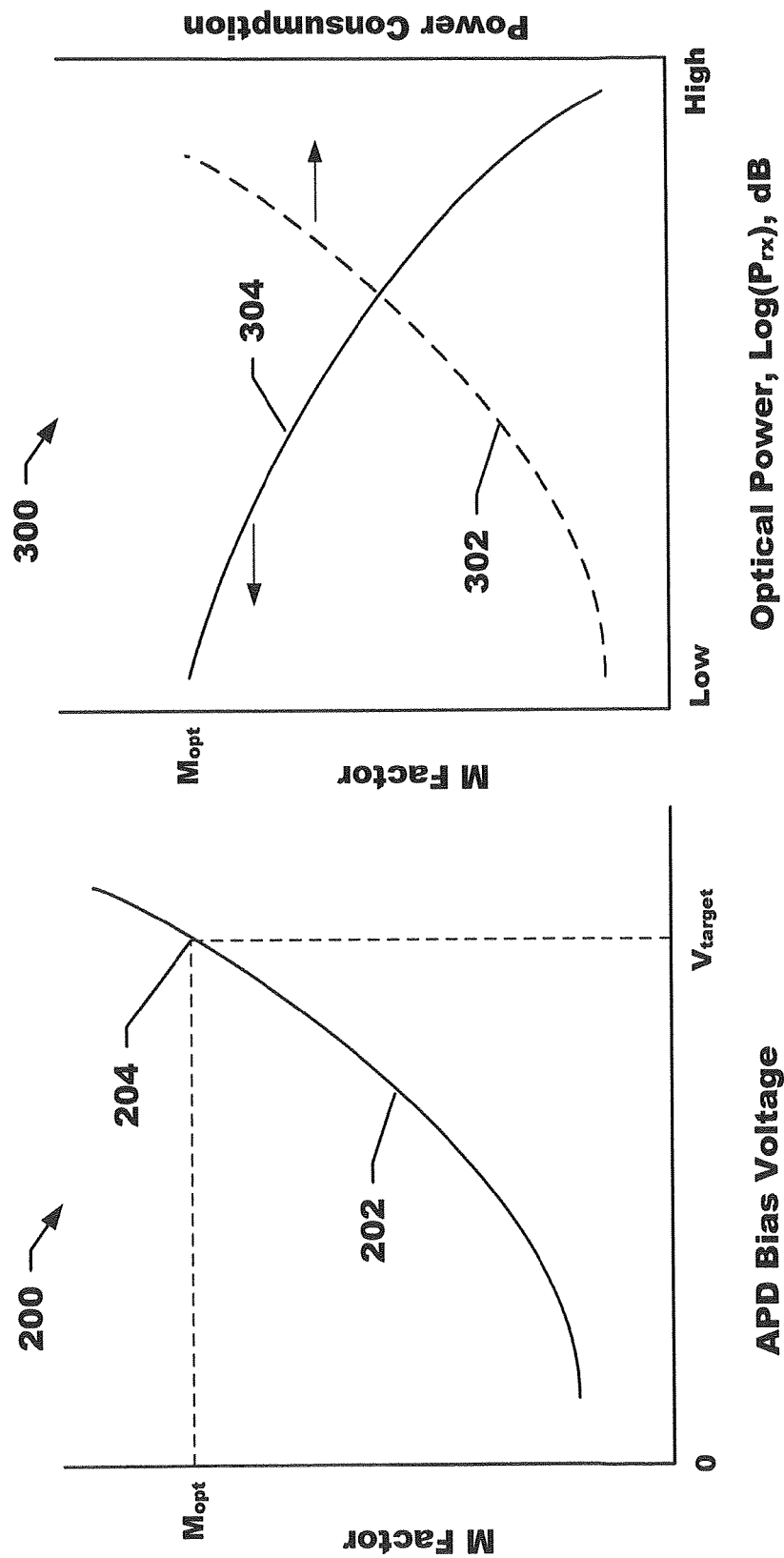
FIG. 2 is a graph of the multiplication factor M as a function of APD bias voltage for the circuit of FIG. 1.
FIG. 3 is a graph of Optical Power versus M factor and system Power Consumption for the circuit of FIG. 1.

FIGS. 1-3 were discussed with reference to the prior art. FIG. 4 is a graph 400 of the multiplication factor M as a function of APD bias voltage for an example control system embodiment. Plot 402 illustrates the variation of M factor with applied bias voltage for an APD. Point 404 on plot 402 selects a high voltage ($V_H$) operating point which yields the highest desirable operating M factor, $M_{opt}$. This M factor is chosen for operation at the lowest suitable input optical power levels and gives sufficient output data signal levels. A second M factor is chosen for operation at high input power levels, $M_{min}$, point 406 on plot 402, corresponding to lower bias voltage $V_L$. The lower M factor $M_{min}$ is chosen with respect to a number of considerations. At high input optical power levels, the APD will produce large currents due to the higher level of illumination, and a large M factor is not needed to produce sufficiently high output signal levels. In fact, operating the APD at large M factors and high input optical power can destroy the APD due to large $I_{apd}$ levels and saturate the trans-impedance amplifier 118 in FIG. 1. Large APD currents also increase circuit power consumption and increase unnecessary heat dissipation. At the low end of the M factor range, APDs may exhibit increased bit error rates (BER), which can rapidly climb with small changes of M factor below $M_{min}$. Therefore it is important to keep the range of M factors applied by the control circuitry hard stopped above $M_{min}$ to avoid excessive bit error rates. The direct way to do this is regulated voltage control of $V_L$.

In an embodiment, set forth by way of example but not limitation, an avalanche photo diode detector system has two ranges wherein the bias voltage across the APD is held fixed. At lower input optical power levels ($P_{rx}$), bias voltage is held at $V_H$, which produces a high M factor $M_{opt}$. At high $P_{rx}$ levels, the APD bias voltage is held at $V_L$ which produces a low M factor $M_{min}$. In the intermediate $P_{rx}$ levels, the control system enables a constant current mode, which holds the signal current flowing through the APD ($I_{apd}$) constant. The net effect of this mode is a varying bias voltage which transitions from $V_H$ to $V_L$, with the accompanying variation of M factor, which transitions from $M_{opt}$ to $M_{min}$. Using the equations $P_{rx}=I_{apd}/(M*R_o)$ and $M=I_{apd}/(P_{rx}*R_o)$, it will be appreciated that for a constant $I_{apd}$ and a constant $R_o$) that M is approximately proportional to $1/P_{rx}$.

FIG. 5 includes a graph 500 of the multiplication factor M as a function of Optical Power. The upper left section of the plot, 502, illustrates the low $P_{rx}$ region, where the bias voltage is held at $V_H$ and the M factor is $M_{opt}$. The lower right section of the plot, 506, illustrates the high $P_{rx}$ region, where the bias voltage is held at $V_L$ and the M factor is $M_{min}$. The low $P_{rx}$ region is terminated at a first power level $P_{rx(1)}$, and the high $P_{rx}$ region is terminated at a second power level $P_{rx(2)}$. The intermediate section of the plot, 504, is located between $P_{rx(1)}$ and $P_{rx(2)}$. Constant voltage bias control, at $V_H$, is enabled in the low $P_{rx}$ region 502. Constant voltage bias control, at $V_L$, is enabled in the high $P_{rx}$ region 506. Constant current control is enabled between $P_{rx(1)}$ and $P_{rx(2)}$, region 508, wherein the M factor (and bias voltage) decreases as $P_{rx}$ increases. If $I_{cc}$ the constant current value, $P_{rx(1)}$ and $P_{rx(2)}$ can be estimated from the equations $P_{rx(1)}=I_{cc}/(M_{opt}*R_o)$ and $P_{rx(2)}=I_{cc}/(M_{min}*R_o)$. By varying the specific value of $I_{cc}$, a designer can shift the intermediate transition section 504 to the left (lower $I_{cc}$) or to the right (higher $I_{cc}$) to accommodate different power dissipation requirements or tailor current levels to APD parameters or specific input optical power requirements.

Figure 6:
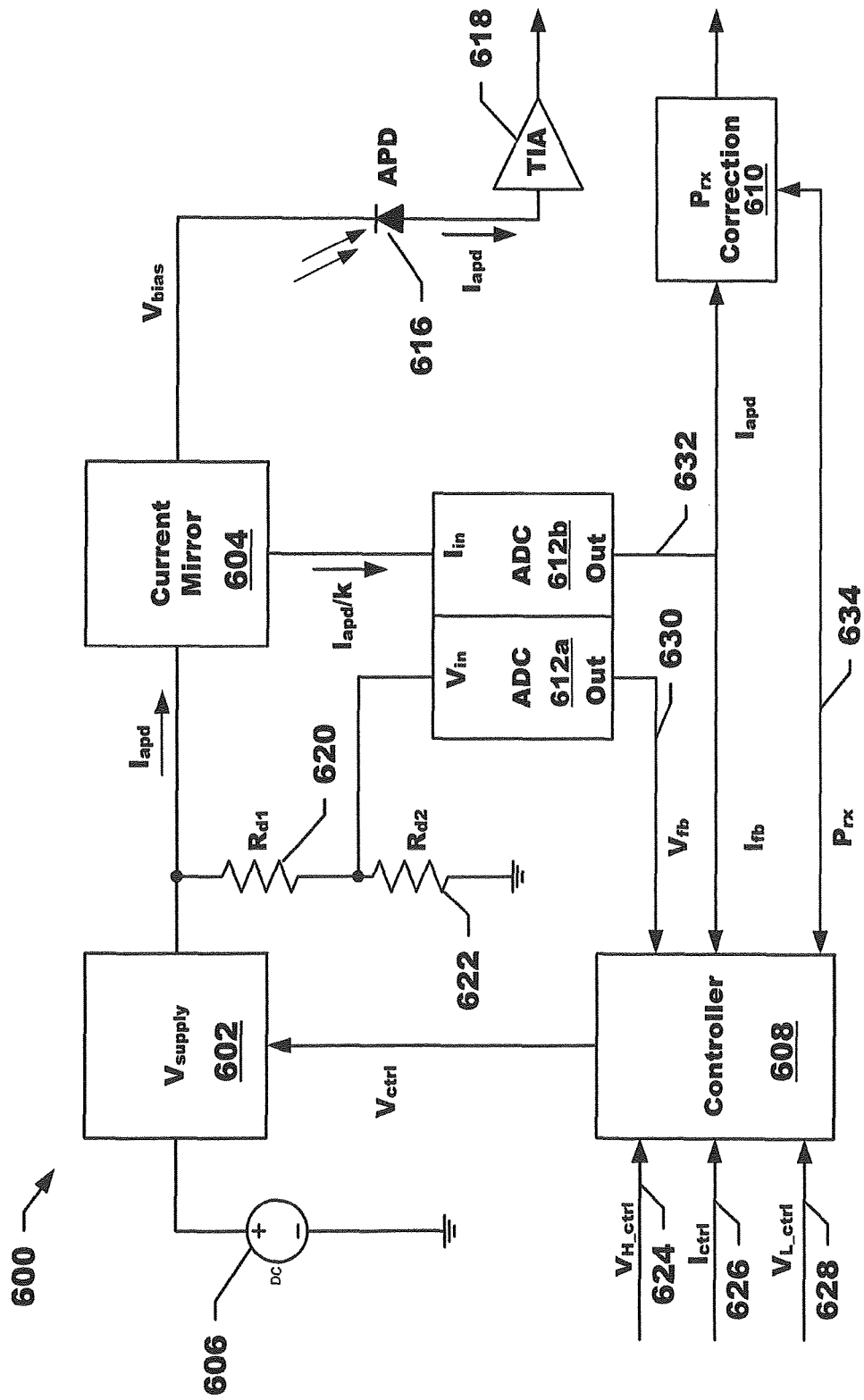
FIG. 6 is a circuit diagram of a constant voltage, constant current, constant voltage APD bias system in accordance with an example control system embodiment.

FIG. 6 is an avalanche photo diode detector system 600, set forth by way of example and not limitation. In this example, bias voltage to an APD 616 is provided by voltage supply circuit module 602 ($V_{supply}$). Module 602 is coupled to D.C. source 606. Typically, the voltage delivered by D.C. source 606 is below the bias voltages required by APD 616, so module 602 must boost (and regulate) the voltages to the required levels.

As will be appreciated by those skilled in the art, D.C. source 606 can also be configured to supply voltages greater than those required to bias APD 616, wherein module 602 simply regulates its output voltage to the required bias voltage levels. Components such as filter capacitors, inductors, and resistors have been omitted from FIG. 6 for clarification, as will be appreciated by those of skill in the art. Module 602 is configured to accept a digital control input, $V_{ctrl}$, which is used by voltage supply module 602 to determine the analog bias voltage output.

The bias voltage output of voltage supply module 602 is provided to a resistance divider network $R_{d1}$ 620 and $R_{d2}$ 622. The output of the resistance divider network is fed to the voltage input of analog to digital converter (ADC) 612a. The signal current output $I_{apd}$ from voltage supply module 602 is passed through current mirror 604 prior to being delivered to APD 616. Current mirror 604 produces a scaled "copy" of $I_{apd}$, $I_{apd}/k$, which is fed to the current input of ADC 612b. The voltage drop across current mirror 604 is assumed to be negligible compared to the bias voltage across APD 616. If not, voltage divider $R_{d1}/R_{d2}$ can be relocated to the output side of current mirror 604 (not shown) to better reflect the actual bias voltage across APD 616.

Optical power ($P_{rx}$) is delivered to control circuit 600 by illuminating APD 616 with a light source (not shown). This may be accomplished through fiber optic cables, lenses, apertures, or the combination of any or all of the forgoing (not shown). The signal current $I_{apd}$ flowing out of APD 616 is fed to transimpedance amplifier (TIA) 618, which converts signal currents to voltage outputs.

The example constant voltage, constant current, constant voltage APD biasing algorithms can be implemented by programmed routines or "code segments" stored in non-volatile memory by processor 608. As will be appreciated by those of skill in the art, processor 608 can be implemented in a number of technologies including microcontroller, state machine and microprocessor technologies to implement processes as described herein.

In this non-limiting example, processor 608 accepts three setpoint digital variables; $V_{H,ctrl}$, $V_{L,ctrl}$, and $L_{ctrl}$. $V_{H,ctrl}$ is the digital representation of the high bias voltage $V_H$ as described above. $V_{L,ctrl}$ is the digital representation of the low bias voltage $V_L$ as described above. $I_{ctrl}$ is the digital representation of the constant current $I_{cc}$. Processor 608 is fed with three feedback digital inputs; $P_{rx}$, $I_{fb}$, and $V_{fb}$. $V_{fb}$ is the digital output 630 of ADC 612a, and represents digital feedback of the bias voltage applied to APD 616. $I_{fb}$ is the digital output 632 of ADC 612b, and represents digital feedback of signal current $I_{apd}$. $P_{rx}$ is the digital output 634 of $P_{rx}$ correction module 610, wherein the estimated optical power is computed from the signal current $I_{apd}$.

In an alternative example embodiment, the functions of the $P_{rx}$ correction module 610 are incorporated into processor 608 (not shown). In that case only $V_{fb}$ and $I_{fb}$ need to be input to controller 608, as $P_{rx}$ is computed by controller 608 internally.

A non-limiting example operation of processor 608 within circuit 600, is as follows. At any given bias voltage and signal current, the input optical power $P_{rx}$ is computed. If $P_{rx}$ is less than or equal to $P_{rx(1)}$, the bias voltage across APD 616 is held constant at $V_H$. If $P_{rx}$ is greater than or equal to $P_{rx(2)}$, then the bias voltage across APD 616 is held fixed at $V_L$. If the input optical power is greater than $P_{rx(1)}$ but less than $P_{rx(2)}$, then controller 608 holds $I_{apd}$ constant by adjusting the bias voltage in a variable manner as to keep equal to its current setpoint input $L_{ctrl}$. Typically, the designer or user sets $L_{ctrl}$ equal to $I_{cc}$.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A method for controlling an avalanche photo diode detector comprising:
   providing an avalanche photo diode optically coupled to a light source, whereby the light source provides an input optical power level to the avalanche photo diode;
   measuring a signal current flowing through the avalanche photo diode in response to the input optical power level;
   computing an estimate of the input optical power level from the signal current measurement; and
   adjusting a voltage bias applied to the avalanche photo diode based on the estimate of the input optical power levels
   wherein the voltage bias is adjusted to a high voltage level $V_H$ for input optical power levels equal to or below a first input optical power level; and
   wherein the signal current passing through the avalanche photo diode is held constant for input optical power levels above the first input optical power level.

2. A method for controlling an avalanche photo diode detector as recited in claim 1 wherein the voltage bias is adjusted to a low voltage level $V_L$ for input optical power levels equal to or above a second input optical power level.

3. A method for controlling an avalanche photo diode detector as recited in claim 1 wherein:
   the voltage bias is adjusted to the high voltage level $V_H$ for input optical power levels equal to or less than the first optical input power level;
   the voltage bias being adjusted to a low voltage level $V_L$ for input optical power levels equal to or greater than a second input optical power level;
   the first input optical power level being less than the second input optical power level; and
   the high voltage level $V_H$ is greater than the low voltage level $V_L$.

4. A method for controlling an avalanche photo diode detector as recited in claim 3 wherein the signal current passing through the avalanche photo diode is held constant for input optical power levels between the first and the second input optical power levels.

5. A method for controlling an avalanche photo diode detector as recited in claim 4 wherein the voltage bias is adjusted between $V_H$ and $V_L$ for input optical power levels between the first and the second input optical power levels.

6. A method for controlling an avalanche photo diode detector as recited in claim 5 wherein the avalanche photo diode exhibits a first M factor at the high voltage level $V_H$.

7. A method for controlling an avalanche photo diode detector as recited in claim 6 wherein the avalanche photo diode exhibits a second M factor at the low voltage level $V_L$.

8. A method for controlling an avalanche photo diode detector as recited in claim 7 wherein the first M factor is greater than the second M factor.

9. A method for controlling an avalanche photo diode detector as recited in claim 8 wherein the avalanche photo diode exhibits M factors between the first M factor and the second M factor with input optical power levels between the first and the second input optical power levels.

10. A method for controlling an avalanche photo diode detector as recited in claim 2 wherein $V_H$ is greater than $V_L$.

11. A method for controlling an avalanche photo diode detector as recited in claim 10 wherein the second input optical power level is greater than the first input optical power level.

12. A method for controlling an avalanche photo diode detector as recited in claim 11 wherein the signal current passing through the avalanche photo diode is held constant for input optical power levels between the first and the second input optical power levels.

13. A method for controlling an avalanche photo diode detector as recited in claim 12 wherein a first M factor exhibited by the avalanche photo diode at input optical power levels less than the first input optical power level is greater than a second M factor exhibited by the avalanche photo diode at input optical power levels greater than the second input optical power level.

14. An avalanche photo diode detector control system comprising:

an avalanche photo diode optically coupled to a light source, whereby the light source provides input optical power to the avalanche photo diode;
an adjustable voltage source having a voltage adjustment input and a voltage source output;
a current mirror coupled to the voltage source output of the adjustable voltage source and having a current measurement output;
a processor coupled to the adjustable voltage source and the current mirror and implementing a process of:
  obtaining a signal current measurement from the current mirror;
  computing an estimate of an input optical power level from the signal current measurement; and
  adjusting the output of the adjustable voltage source based upon on the
estimate of the input optical power level;
wherein the output of the adjustable voltage source is adjusted to a high bias voltage setpoint input by the processor for input optical power levels equal to or below a first input optical power level; and
wherein the signal current passing through the avalanche photo diode is held constant for input optical power levels above the first input optical power level.

15. An avalanche photo diode detector control system as recited in claim 14 wherein the processor is provided with the high bias voltage setpoint input, a low bias voltage setpoint input, and a constant signal current setpoint input.

16. An avalanche photo diode detector control system as recited in claim 15 wherein the output of the adjustable voltage source is adjusted to the low bias voltage setpoint by the processor for input optical power levels equal to or above a second optical input power level.

17. An avalanche photo diode detector control system as recited in claim 16 wherein the output of the adjustable voltage source is adjusted by the processor to maintain the constant signal current level at the constant signal current setpoint for input optical power levels between the first and the second input optical power levels.

18. An avalanche photo diode detector control system as recited in claim 14 wherein computation of the estimate of the input optical power level from the signal current measurement is carried out by code segments executed by the processor.

* * * * *